United States Patent
Spitsberg et al.

(10) Patent No.: US 7,255,940 B2
(45) Date of Patent: Aug. 14, 2007

(54) THERMAL BARRIER COATINGS WITH HIGH FRACTURE TOUGHNESS UNDERLAYER FOR IMPROVED IMPACT RESISTANCE

(75) Inventors: Irene Spitsberg, Loveland, OH (US); Brett Allen Boutwell, Liberty Township, OH (US); Robert William Bruce, Loveland, OH (US)

(73) Assignee: General Electric Company, Schnectady, NY (US)

( * ) Notice: Subject to any disclaimer, the term of this patent is extended or adjusted under 35 U.S.C. 154(b) by 244 days.

(21) Appl. No.: 10/898,776

(22) Filed: Jul. 26, 2004

(65) Prior Publication Data
US 2006/0019119 A1 Jan. 26, 2006

(51) Int. Cl.
*B32B 15/04* (2006.01)
*F03B 3/12* (2006.01)
(52) U.S. Cl. ............... 428/701; 428/632; 428/702; 428/336; 416/241 B
(58) Field of Classification Search ............... 428/698, 428/701, 702, 336; 416/241 B
See application file for complete search history.

(56) References Cited

U.S. PATENT DOCUMENTS

| | | | |
|---|---|---|---|
| 4,861,618 A | 8/1989 | Vine et al. | |
| 5,350,599 A | 9/1994 | Rigney et al. | |
| 5,384,200 A * | 1/1995 | Giles et al. | 428/552 |
| 5,687,679 A * | 11/1997 | Mullin et al. | 123/41.79 |
| 5,705,231 A | 1/1998 | Nissley et al. | |
| 5,780,171 A * | 7/1998 | Nissley et al. | 428/629 |
| 5,942,334 A | 8/1999 | Wortman | |
| 5,981,088 A | 11/1999 | Bruce et al. | |
| 6,025,078 A | 2/2000 | Rickerby et al. | |
| 6,054,184 A | 4/2000 | Bruce et al. | |
| 6,117,560 A | 9/2000 | Maloney | |
| 6,123,997 A | 9/2000 | Schaeffer et al. | |

(Continued)

OTHER PUBLICATIONS

Hwang et al., "Grain Size Control of Tetragonal Zirconia Polycrystals Using the Space Charge Concept", J. Am. Ceram. Soc., 1990, 73(11):3269-77.

(Continued)

*Primary Examiner*—Jennifer McNeil
(74) *Attorney, Agent, or Firm*—Marcella R. Louke; William Scott Andes

(57) ABSTRACT

A reduced thermal conductivity thermal barrier coating having improved impact resistance for an underlying substrate of articles that operate at, or are exposed to, high temperatures. This coating comprises an inner high fracture toughness layer nearest to the underlying substrate and having a thickness up to about 5 mils (127 microns) sufficient to impart impact resistance to the thermal barrier coating, and comprises a zirconia-containing ceramic composition having a c/a ratio of the zirconia lattice in the range of from about 1.011 to about 1.016 and stabilized in the tetragonal phase by a stabilizing amount of a stabilizing metal oxide selected from the group consisting of yttria, calcia, ceria, scandia, magnesia, india, lanthana, gadolinia, neodymia, samaria, dysprosia, erbia, ytterbia, europia, praseodymia, and mixtures thereof. The thermal barrier coating further includes an outer thermal insulating layer adjacent to and overlaying the inner layer and comprising a ceramic thermal barrier coating material. The thermal barrier can be used to provide a thermally protected article having a substrate (e.g., metal substrate) and optionally a bond coat layer adjacent to and overlaying the substrate. The thermal barrier coating can be prepared by forming the inner high fracture toughness layer, followed by forming on the inner layer the outer thermal insulating layer.

20 Claims, 2 Drawing Sheets

U.S. PATENT DOCUMENTS

| | | | |
|---|---|---|---|
| 6,183,884 B1 | 2/2001 | Rickerby | |
| 6,284,323 B1 | 9/2001 | Maloney | |
| 6,319,614 B1 | 11/2001 | Beele | |
| 6,333,118 B1 | 12/2001 | Alperine et al. | |
| 6,352,788 B1 * | 3/2002 | Bruce | 428/633 |
| 6,387,526 B1 | 5/2002 | Beele | |
| 6,465,090 B1 | 10/2002 | Stowell et al. | |
| 6,764,779 B1 * | 7/2004 | Liu et al. | 428/702 |
| 6,869,703 B1 * | 3/2005 | Spitsberg et al. | 428/701 |
| 2002/0172838 A1 * | 11/2002 | Rigney et al. | 428/633 |
| 2003/0044624 A1 | 3/2003 | Spitsberg et al. | |
| 2003/0224200 A1 | 12/2003 | Bruce | |

OTHER PUBLICATIONS

Kim, "Effect of $Ta_2O_5$, $Nb_2O_5$, and $HfO_2$ Alloying on the Transformability of $Y_2O_3$-Stabilized Tetragonal $ZrO_2$", J. Am. Ceram. Soc., 73(1):115-120.

Nakayama et al., "Effect of $La_2O_3$ Addition on Thermal Stability of Y-TZP," J. Mat. Sci. Lett., 18:1339-41 (1999).

Vassen et al., "Zirconates as New Materials for Thermal Barrier Coatings," J. Am. Ceram. Soc., 83(8):2023-28 (2000).

Chen et al, "Mechanisms Governing the High Temperature Erosion of Thermal Barrier Coatings," Wear, 256:735-46 (2004).

U.S. Appl. No. 10/748,516, filed Dec. 30, 2003, Gorman et al.

U.S. Appl. No. 10/748,517, filed Dec. 30, 2003, Boutwell et al.

U.S. Appl. No. 10/748,519, filed Dec. 30, 2003, Darolia et al.

U.S. Appl. No. 10/748,508, filed Dec. 30, 2003, Spitsberg et al.

U.S. Appl. No. 10/748,520, filed Dec. 30, 2003, Spitsberg et al.

U.S. Appl. No. 10/748,521, filed Dec. 30, 2003, Spitsberg et al.

U.S. Appl. No. 10/748,518, filed Dec. 30, 2003, Spitsberg et al.

U.S. Appl. No. 10/748,513, filed Dec. 30, 2003, Spitsberg et al.

U.S. Appl. No. 10/830,685, filed Apr. 21, 2004, Gorman et al.

* cited by examiner

THERMAL BARRIER COATINGS WITH HIGH FRACTURE TOUGHNESS UNDERLAYER FOR IMPROVED IMPACT RESISTANCE

BACKGROUND OF THE INVENTION

This invention relates to improving the impact and spallation resistance of thermal barrier coatings, especially those coatings having reduced thermal conductivity. This invention further relates to articles having such coatings and methods for preparing such coatings for the article.

Components operating in the gas path environment of gas turbine engines are typically subjected to significant temperature extremes and degradation by oxidizing and corrosive environments. Environmental coatings and especially thermal barrier coatings are an important element in current and future gas turbine engine designs, as well as other articles that are expected to operate at or be exposed to high temperatures, and thus cause the thermal barrier coating to be subjected to high surface temperatures. Examples of turbine engine parts and components for which such thermal barrier coatings are desirable include turbine blades and vanes, turbine shrouds, buckets, nozzles, combustion liners and deflectors, and the like. These thermal barrier coatings typically comprise the external portion or surface of these components and are usually deposited onto a metal substrate (or more typically onto a bond coat layer on the metal substrate for better adherence) from which the part or component is formed to reduce heat flow (i.e., provide thermal insulation) and to limit (reduce) the operating temperature the underlying metal substrate of these parts and components is subjected to. This metal substrate typically comprises a metal alloy such as a nickel, cobalt, and/or iron based alloy (e.g., a high temperature superalloy).

The thermal barrier coating is usually prepared from a ceramic material, such as a chemically (metal oxide) stabilized zirconia. Examples of such chemically stabilized zirconias include yttria-stabilized zirconia, scandia-stabilized zirconia, calcia-stabilized zirconia, and magnesia-stabilized zirconia. The thermal barrier coating of choice is typically a yttria-stabilized zirconia ceramic coating. A representative yttria-stabilized zirconia thermal barrier coating usually comprises about 7 weight % yttria and about 93 weight % zirconia. The thickness of the thermal barrier coating depends upon the metal part or component it is deposited on, but is usually in the range of from about 3 to about 70 mils (from about 76 to about 1778 microns) thick for high temperature gas turbine engine parts.

Although significant advances have been made in improving the durability of thermal barrier coatings for turbine engine components, such coatings are still susceptible to various types of damage, including objects ingested by the engine, erosion, oxidation, and attack from environmental contaminants. In addition, in trying to achieve reduced thermal conductivity, other properties of the thermal barrier coating can be adversely impacted. For example, the composition and crystalline microstructure of a thermal barrier coating, such as those prepared from yttria-stabilized zirconia, can be modified to impart to the coating an improved reduction in thermal conductivity, especially as the coating ages over time. However, such modifications can also unintentionally interfere with desired spallation resistance, especially at the higher temperatures that most turbine components are subjected to. As a result, the thermal barrier coating can become more susceptible to damage due to the impact of, for example, objects and debris ingested by the engine and passing through the turbine sections thereof. Such impact damage can eventually cause spallation and loss of the thermal barrier coating.

Accordingly, it would be desirable to be able to improve the impact resistance of thermal barrier coatings, especially those coatings having reduced thermal conductivity, to avoid spallation. It would be further desirable to be able to provide such spallation and impact resistance, yet still be able to modify the chemical composition of yttria-stabilized zirconia-based thermal barrier coating systems to provide reduced thermal conductivity.

BRIEF DESCRIPTION OF THE INVENTION

An embodiment of this invention relates to improving the impact and spallation resistance of a thermal barrier coating, especially one having reduced thermal conductivity, that is used with the underlying substrate of articles that operate at, or are exposed to, high temperatures. This thermal barrier coating comprises:

1. an inner high fracture toughness layer closest to the underlying substrate, the inner layer having a thickness up to about 5 mils (127 microns) and sufficient to impart impact resistance to the thermal barrier coating, and comprising a zirconia-containing ceramic composition having a c/a ratio of the zirconia lattice in the range of from about 1.011 to about 1.016 and stabilized in the tetragonal phase by a stabilizing amount of a stabilizing metal oxide selected from the group consisting of yttria, calcia, ceria, scandia, magnesia, india, lanthana, gadolinia, neodymia, samaria, dysprosia, erbia, ytterbia, europia, praseodymia, and mixtures thereof; and 2. an outer thermal insulating layer adjacent to and overlaying the inner protective layer and comprising a ceramic thermal barrier coating material.

Another embodiment of this invention relates to a thermally protected article. This protected article comprises:

A. a substrate;

B. optionally a bond coat layer adjacent to and overlaying the substrate; and

C. a thermal barrier coating (as previously described) adjacent to and overlaying the bond coat layer (or overlaying the substrate if the bond coat layer is absent).

Another embodiment of this invention relates to a method for preparing the thermal barrier coating on a substrate to provide a thermally protected article. This method comprises the steps of:

A. optionally forming a bond coat layer on the substrate;

B. depositing on the bond coat layer (or on the substrate in the absence of the bond coat layer) the zirconia-containing ceramic composition to form the high fracture toughness layer as previously described thereon; and C. depositing on the high fracture toughness layer the ceramic thermal barrier coating material to form the thermal insulating layer as previously described.

The thermal barrier coatings of this invention provide several significant benefits when used with substrates, especially metal substrates, of articles exposed to high temperatures, such as turbine components. The thermal barrier coatings of this invention have improved impact and spallation resistance, even though the high fracture toughness layer of the thermal barrier coating is closest to the substrate/bond coat layer. This improvement in impact and spallation resistance for the thermal barrier coating can be achieved while allowing the flexibility to use a variety of zirconia-containing ceramic compositions that can impart to the thermal barrier coating desirable reduced thermal conductivity properties.

DETAILED DESCRIPTION OF THE INVENTION

Figure 1:
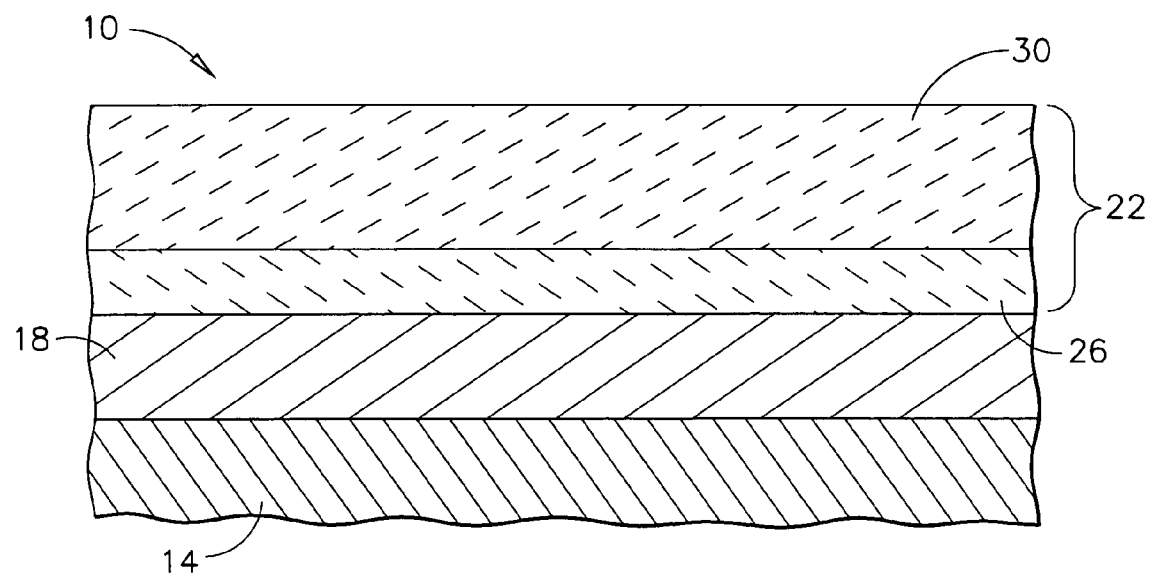
FIG. 1 is a partial side sectional view of an embodiment of the thermal barrier coating and coated article of this invention.

As used herein, the term "ceramic thermal barrier coating materials" refers to those coating materials that are capable of reducing heat flow to the underlying substrate (e.g., metal substrate) of the article, i.e., forming a thermal barrier, and which have a melting point that is typically at least about 2600° F. (1426° C.), and more typically in the range of from about 3450° to about 4980° F. (from about 1900° to about 2750° C.). Suitable ceramic thermal barrier coating materials for use herein include, aluminum oxide (alumina), i.e., those compounds and compositions comprising $Al_2O_3$, including unhydrated and hydrated forms, various zirconias, in particular chemically phase-stabilized zirconias (i.e., various metal oxides such as yttrium oxides blended with zirconia), such as yttria-stabilized zirconias, ceria-stabilized zirconias, calcia-stabilized zirconias, scandia-stabilized zirconias, magnesia-stabilized zirconias, india-stabilized zirconias, ytterbia-stabilized zirconias as well as mixtures of such stabilized zirconias. See, for example, Kirk-Othmer's Encyclopedia of Chemical Technology, 3rd Ed., Vol. 24, pp. 882-883 (1984) for a description of suitable zirconias. Suitable yttria-stabilized zirconias can comprise from about 1 to about 20% yttria (based on the combined weight of yttria and zirconia), and more typically from about 3 to about 10% yttria. These chemically stabilized zirconias can further include one or more of a second metal (e.g., a lanthanide or actinide) oxide such as dysprosia, erbia, europia, gadolinia, neodymia, praseodymia, urania, and hafnia to further reduce thermal conductivity of the thermal barrier coating. See U.S. Pat. No. 6,025,078 (Rickerby et al), issued Feb. 15, 2000 and U.S. Pat. No. 6,333,118 (Alperine et al), issued Dec. 21, 2001, both of which are incorporated by reference. Suitable ceramic thermal barrier coating materials also include pyrochlores of general formula $A_2B_2O_7$ where A is a metal having a valence of 3+ or 2+ (e.g., gadolinium, aluminum, cerium, lanthanum or yttrium) and B is a metal having a valence of 4+ or 5+ (e.g., hafnium, titanium, cerium or zirconium) where the sum of the A and B valences is 7. Representative materials of this type include gadolinium-zirconate, lanthanum titanate, lanthanum zirconate, yttrium zirconate, lanthanum hafnate, cerium zirconate, aluminum cerate, cerium hafnate, aluminum hafnate and lanthanum cerate. See U.S. Pat. No. 6,117,560 (Maloney), issued Sep. 12, 2000; U.S. Pat. No. 6,177,200 (Maloney), issued Jan. 23, 2001; U.S. Pat. No. 6,284,323 (Maloney), issued Sep. 4, 2001; U.S. Pat. No. 6,319,614 (Beele), issued Nov. 20, 2001; and U.S. Pat. No. 6,387,526 (Beele), issued May 14, 2002, all of which are incorporated by reference.

Suitable ceramic compositions for use herein are also disclosed in copending U.S. nonprovisional applications entitled "CERAMIC COMPOSITIONS USEFUL FOR THERMAL BARRIER COATINGS HAVING REDUCED THERMAL CONDUCTIVITY" (Spitsberg et al), Ser. No. 10/748,508, filed Dec. 30, 2003 and entitled "CERAMIC COMPOSITIONS USEFUL IN THERMAL BARRIER COATINGS HAVING REDUCED THERMAL CONDUCTIVITY" (Spitsberg et al), Ser. No. 10/748,520, filed Dec. 30, 2003, both of which are incorporated by reference. The ceramic compositions disclosed in the first of these copending applications comprise at least about 91 mole % zirconia and up to about 9 mole % of a stabilizer component comprising a first metal oxide having selected from the group consisting of yttria, calcia, ceria, scandia, magnesia, india, ytterbia and mixtures thereof; a second metal oxide of a trivalent metal atom selected from the group consisting of lanthana, gadolinia, neodymia, samaria, dysprosia, and mixtures thereof; and a third metal oxide of a trivalent metal atom selected from the group consisting of erbia, ytterbia and mixtures thereof. Typically, these ceramic compositions comprise from about 91 to about 97 mole % zirconia, more typically from about 92 to about 95 mole % zirconia and from about 3 to about 9 mole %, more typically from about from about 5 to about 8 mole %, of the composition of the stabilizing component; the first metal oxide (typically yttria) can comprise from about 3 to about 6 mole %, more typically from about 3 to about 5 mole %, of the ceramic composition; the second metal oxide (typically lanthana or gadolinia) can comprise from about 0.25 to about 2 mole %, more typically from about 0.5 to about 1.5 mole %, of the ceramic composition; and the third metal oxide (typically ytterbia) can comprise from about 0.5 to about 2 mole %, more typically from about 0.5 to about 1.5 mole %, of the ceramic composition, with the ratio of the second metal oxide to the third metal oxide typically being in the range of from about 0.5 to about 2, more typically from about 0.75 to about 1.33.

The ceramic compositions disclosed in the second of these copending applications comprise at least about 91 mole % zirconia and up to about 9 mole % of a stabilizer component comprising a first metal oxide selected from the group consisting of yttria, calcia, ceria, scandia, magnesia, india and mixtures thereof and a second metal oxide of a trivalent metal atom selected from the group consisting of lanthana, gadolinia, neodymia, samaria, dysprosia, erbia, ytterbia, and mixtures thereof. Typically, these ceramic compositions comprise from about 91 to about 97 mole % zirconia, more typically from about 92 to about 95 mole % zirconia and from about 3 to about 9 mole %, more typically from about from about 5 to about 8 mole %, of the composition of the stabilizing component; the first metal oxide (typically yttria) can comprise from about 3 to about 6 mole %, more typically from about 4 to about 5 mole %, of the ceramic composition; the second metal oxide (typically lanthana, gadolinia or ytterbia, and more typically lanthana) can comprise from about 0.5 to about 4 mole %, more typically from about 0.8 to about 2 mole %, of the ceramic composition, and wherein the mole % ratio of second metal oxide (e.g., lanthana/gadolinia/ytterbia) to first metal oxide (e.g., yttria) is in the range of from about 0.1 to about 0.5, typically from about 0.15 to about 0.35, more typically from about 0.2 to about 0.3.

As used herein, the term "fraction of porosity" refers to the volume fraction of porosity defined by unity (i.e., 1), minus the ratio of the actual density of the thermal barrier coating to its theoretical density.

As used herein, the term "fracture toughness" refers to the measurement of the resistance of the specimen being tested to extension of a crack. See Davis, ASM Materials Engineering Dictionary (1992), p. 72.

As used herein, the term "comprising" means various compositions, compounds, components, layers, steps and the like can be conjointly employed in the present invention. Accordingly, the term "comprising" encompasses the more restrictive terms "consisting essentially of" and "consisting of."

All amounts, parts, ratios and percentages used herein are in wt. % unless otherwise specified.

Thermal barrier coatings of this invention are useful with a wide variety of turbine engine (e.g., gas turbine engine) parts and components that are formed from substrates, especially metal substrates comprising a variety of metals and metal alloys, including superalloys, and are operated at, or exposed to, high temperatures, especially higher temperatures that occur during normal engine operation. These turbine engine parts and components can include turbine airfoils such as blades and vanes, turbine shrouds, turbine nozzles, combustor components such as liners and deflectors, augmentor hardware of gas turbine engines and the like. The thermal barrier coatings of this invention can also cover a portion or all of the substrate. For example, with regard to airfoils such as blades, the thermal barrier coatings of this invention are typically used to protect, cover or overlay portions of the substrate of the airfoil rather than the entire component, e.g., the thermal barrier coatings could cover the leading edge, possibly part of the trailing edge, but not the attachment area. While the following discussion of the thermal barrier coatings of this invention will be with reference to substrates of turbine engine parts and components, it should also be understood that the thermal barrier coatings of this invention are useful with substrates of other articles that operate at, or are exposed to, high temperatures.

The various embodiments of the thermal barrier coatings of this invention are further illustrated by reference to the drawings as described hereafter. Referring to the drawings, FIG. 1 shows a side sectional view of an embodiment of the thermal barrier coating used with the metal substrate of an article indicated generally as 10. As shown in FIG. 1, article 10 has a metal substrate indicated generally as 14. Substrate 14 can comprise any of a variety of metals, or more typically metal alloys, that are typically protected by thermal barrier coatings, including those based on nickel, cobalt and/or iron alloys. For example, substrate 14 can comprise a high temperature, heat-resistant alloy, e.g., a superalloy. Such high temperature alloys are disclosed in various references, such as U.S. Pat. No. 5,399,313 (Ross et al), issued Mar. 21, 1995 and U.S. Pat. No. 4,116,723 (Gell et al), issued Sep. 26, 1978, both of which are incorporated by reference. High temperature alloys are also generally described in Kirk-Othmer's Encyclopedia of Chemical Technology, 3rd Ed., Vol. 12, pp. 417-479 (1980), and Vol. 15, pp. 787-800 (1981). Illustrative high temperature nickel-based alloys are designated by the trade names Inconel®, Nimonic®, René® (e.g., René® 80 alloys, René® N5 alloys), and Udimet®. As described above, the type of substrate 14 can vary widely, but it is representatively in the form of a turbine part or component, such as an airfoil (e.g., blade) or turbine shroud.

As shown in FIG. 1, article 10 can also include a bond coat layer indicated generally as 18 that is adjacent to and overlies substrate 14. Bond coat layer 18 is typically formed from a metallic oxidation-resistant material that protects the underlying substrate 14 and enables the thermal barrier coating indicated generally as 22 to more tenaciously adhere to substrate 14. Suitable materials for bond coat layer 18 include overlay bond coatings such MCrAlY alloys (e.g., alloy powders), where M represents a metal such as iron, nickel, platinum or cobalt, or NiAl(Zr) overlay coatings, as well as various noble metal diffusion aluminides such as platinum aluminide, as well as simple aluminides (i.e., those formed without noble metals) such as nickel aluminide. This bond coat layer 18 can be applied, deposited or otherwise formed on substrate 10 by any of a variety of conventional techniques, such as electroless plating, physical vapor deposition (PVD), including electron beam physical vapor deposition (EB-PVD), plasma spray, including air plasma spray (APS) and vacuum plasma spray (VPS), ion plasma, or other thermal spray deposition methods such as high velocity oxy-fuel (HVOF) spray, detonation, or wire spray, chemical vapor deposition (CVD), pack cementation and vapor phase aluminiding in the case of metal diffusion aluminides (see, for example, U.S. Pat. No. 4,148,275 (Benden et al), issued Apr. 10, 1979; U.S. Pat. No. 5,928,725 (Howard et al), issued Jul. 27, 1999; and U.S. Pat. No. 6,039,810 (Mantkowski et al), issued Mar. 21, 2000, all of which are incorporated by reference and which disclose various apparatus and methods for applying diffusion aluminide coatings), and combinations thereof. Typically, if a plasma spray or diffusion technique is employed to deposit bond coat layer 18, the thickness is in the range of from about 1 to about 20 mils (from about 25 to about 508 microns). For bond coat layers 18 deposited by PVD techniques such as EB-PVD or diffusion aluminide processes, the thickness is more typically in the range of from about 1 about 3 mils (from about 25 to about 76 microns).

As shown in FIG. 1, thermal barrier coating (TBC) 22 of this invention is adjacent to and overlies bond coat layer 18. The thickness of TBC 22 is typically in the range of from about 1 to about 100 mils (from about 25 to about 2540 microns) and will depend upon a variety of factors, including the design parameters for article 10 that are involved. For example, for turbine shrouds, TBC 22 is typically thicker and is usually in the range of from about 30 to about 70 mils (from about 762 to about 1778 microns), more typically from about 40 to about 60 mils (from about 1016 to about 1524 microns). By contrast, in the case of turbine blades, TBC 22 is typically thinner and is usually in the range of from about 3 to about 30 mils (from about 76 to about 762 microns), more typically from about 3 to about 10 mils (from about 76 to about 254 microns).

TBC 22 comprises a high fracture toughness inner layer indicated generally as 26 that is adjacent to and overlies bond coat layer 18. It has been found that spallation and removal of TBC 22 caused by impact damage typically does not occur in a gradual, erosion-like fashion. Instead, it has been found to typically be the result of vertically extending crack(s) forming and propagating from the outer surface of TBC 22 (due to the impact of hard objects), to the interface between TBC 22 and bond coat layer 18, thus causing failure of the TBC 22 at or proximate to this interface, i.e., where final delamination of TBC 22 occurs. It has been further found that horizontally extending cracks can also form at various depths or levels of TBC 22 that are spaced from this interface. As a result, a series of "tiered" sections or layers can become detached and lost where these horizontal cracks form in TBC 22. The high fracture toughness inner of layer 26 of TBC 22 positioned at the interface between bond coat layer 18 and outer thermal insulating layer 30 is believed to interrupt the propagation of these vertically extending cracks, as well as to minimize or prevent the formation and propagation of the horizontally extending cracks, thus imparting impact and spallation resistance to TBC 22, and especially to outer thermal insulating layer 30. The use of such a high fracture toughness inner layer 26 can be especially desirable for certain outer thermal insulating layers 30 having reduced thermal conductivity that tend to be more susceptible to such vertical crack propagation caused by impact damage.

Inner layer 26 is typically formed as a relatively thin layer to impart impact and spallation resistance to TBC 22, especially to outer layer 30, and so as not to unduly affect the other desirable (e.g., mechanical and thermal insulating) properties of TBC 22, including strain tolerance, modulus and thermal conductivity. In this regard, inner layer 26 should have a thickness up to about 5 mils (127 microns). Typically, the thickness of inner layer 26 is in the range of from about 0.5 to about 2 mils (from about 13 to about 51 microns), more typically from about 1 to about 2 mils (from about 25 to about 51 microns).

Inner layer 26 of TBCs 22 of this invention comprises a zirconia-containing ceramic composition that is stabilized in a certain region of the tetragonal phase so as to increase fracture toughness and thus impart improved impact resistance properties for TBC 22. The fracture toughness and impact resistance properties of these inner layers 26 can be predicted on the basis of the effect of the zirconia lattice stability equivalent of the respective zirconia-containing ceramic compositions. Fracture toughness and impact resistance performance have been found to be related to the zirconia lattice stability equivalent. This stability equivalent can be calculated based on the ratio of the zirconia lattice parameters c and a using equation (1) below:

$$\frac{c}{a} = k_1 \sum_i (r_i - r_{Zr}) \times m_i + k_2 \sum_i (V_i - V_{Zr}) \times m_i \quad (1)$$

wherein c,a are the zirconia tetragonal lattice parameters, $r_i$ is the ionic radius of the first metal oxide, $v_i$ is the valence of the metal ion of the metal oxide added, $m_i$ is the mole fraction of the metal oxide added and $k_1$ and $k_2$ are constants. See Kim, "Effect of $Ta_2O_5$, $Nb_2O_5$, and $HfO_2$ Alloying on the Transformability of $Y_2O_3$-Stabilized Tetragonal $ZrO_2$," *J. Am. Ceram. Soc.*, (1990) 73(1):115-120.

Figure 2:
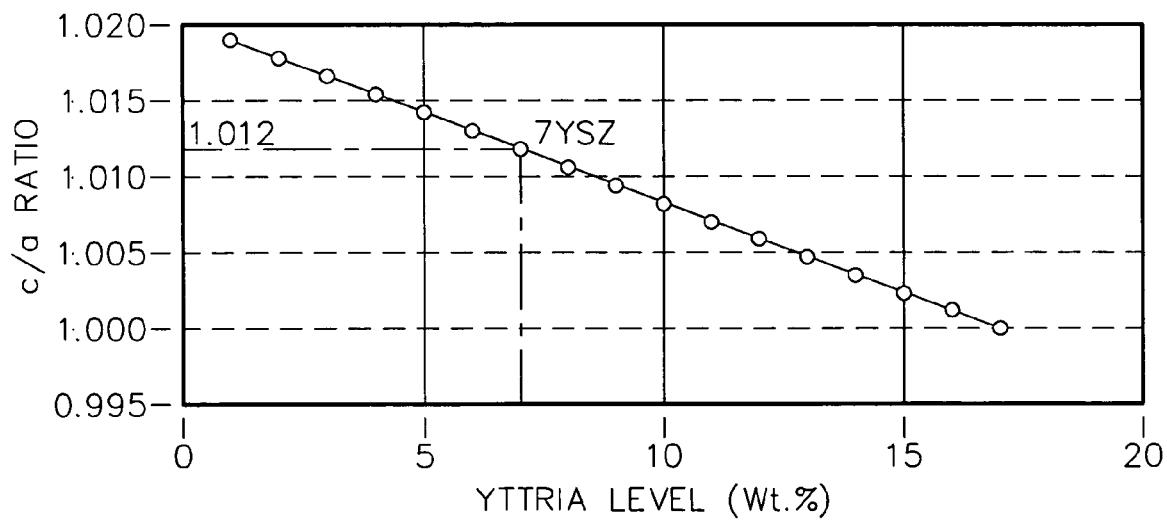
FIG. 2 represents a graphical plot of calculated c/a ratios of the zirconia lattice as a function of yttria content.

Using equation (1) above, the lattice stability of these zirconia-containing ceramic compositions in the tetragonal phase can be calculated, including the effect of incremental additions of the stabilizing metal oxide, such as yttria. This is illustrated by FIG. 2 which represents a graphical plot of calculated c/a ratios for the zirconia lattice as a function of yttria content. The dotted line (base line) in FIG. 2 represents a zirconia-containing-ceramic composition stabilized with the equivalent of about 7 wt. % yttria (7YSZ) that has a c/a ratio of about 1.012. As also shown in FIG. 2, as the level of yttria decreases in the zirconia-containing ceramic composition, the c/a ratio conversely increases. It has been further found that, as the c/a ratio increases, fracture toughness increases and impact resistance improves, i.e., lowering the yttria level increases fracture toughness and improves the impact resistance performance of the high fracture toughness inner layer 26 comprising the zirconia-containing ceramic composition.

To provide high fracture toughness inner layers 26 having suitable impact resistance performance, the zirconia-containing-ceramic composition should have a c/a ratio that is typically in the range of from about 1.011 to about 1.016, more typically in the range of from about 1.013 to about 1.015. Suitable zirconia-containing compositions for use in high fracture toughness inner layer 26 that have these c/a ratios can comprise at least about 90% zirconia. Typically, these zirconia-containing compositions comprise from about 93 to about 96% zirconia, more typically from about 93.5 to about 95.5% zirconia. Suitable zirconia-containing compositions for use in high fracture toughness inner layer 26 that have these c/a ratios further comprise a stabilizing amount of a stabilizing metal oxide. Typically, the stabilizing metal oxide is included in an amount of from about 4 to about 7% of the composition. Suitable stabilizing metal oxides can be selected from the group consisting of yttria, calcia, ceria, scandia, magnesia, india, lanthana, gadolinia, neodymia, samaria, dysprosia, erbia, ytterbia, europia, praseodymia, and mixtures thereof. The zirconia-containing ceramic compositions useful in high fracture toughness inner layers 26 typically comprise yttria as the stabilizing metal oxide in an amount from about 4.5 to about 6.5% of the composition.

While the c/a ratio of the zirconia-containing composition has an especially strong effect on fracture toughness and impact resistance performance, it has been further found that the porosity level of the resultant protective inner layer 26 of TBC 22 has an effect as well. Accordingly, additional fracture toughness and impact resistance benefits can be obtained by optionally making inner layer 26 denser, i.e., by reducing its porosity. This is typically achieved by forming inner layer 26 so as to have a fraction of porosity of about 0.20 or less, more typically about 0.15 or less. Typically, inner layer 26 has a fraction of porosity of from about 0.10 to about 0.20–, more typically from about 0.10 to about 0.15.

Further fracture toughness and impact resistance benefits can be obtained by optionally having present in inner layer 26 up to about 10% hafnia. Typically, hafnia is present in inner layer 26 in an amount of from about 2 to about 7%, more typically from about 4 to about 6%. Other metal oxides, such as lanthana, neodymia, gadolinia and mixtures thereof can also be optionally present in inner layer 26 in amounts up to about 1%, more typically in the range of from about 0.3 about 0.5%. Suitable zirconia-containing ceramic compositions that comprise hafnia and/or these other metal oxides include those shown in the following Table 1:

TABLE 1

| Metal Oxide (Wt. %) | Composition 1 | Composition 2 | Composition 3 |
|---|---|---|---|
| Zirconia | 91.6 | 95.5 | 95.6 |
| Yttria | 4.0 | 4.0 | 4.0 |
| Hafnia | 4.4 | | |
| Lanthana | | 0.5 | |
| Neodymia | | | 0.4 |

Referring to the FIG. 1, high fracture toughness inner layer 26 of TBC 22 can be applied, deposited or otherwise formed on bond coat layer 18 by any of a variety of conventional techniques, such as wet plating, physical vapor deposition (PVD), including electron beam physical vapor deposition (EB-PVD), plasma spray, including air plasma spray (APS) and vacuum plasma spray (VPS), or other thermal spray deposition methods such as high velocity oxy-fuel (HVOF) spray, detonation, or wire spray; chemical vapor deposition (CVD), or combinations thereof. The particular technique used for applying, depositing or otherwise forming inner layer 26 will typically depend on the composition of inner layer 26, its thickness and especially the physical structure desired for the TBC. For example, PVD techniques tend to be useful in forming TBCs having a strain-tolerant columnar structure. By contrast, plasma spray techniques (e.g., APS) tend to create a splat-layered porous structure in inner layer 26. Inner layer 26 of TBC 22 is typically formed from ceramic thermal barrier coating materials by PVD and especially EB-PVD techniques to provide a strain-tolerant columnar structure.

As shown in the FIG. 1, TBC 22 further comprises a thermal insulating outer layer 30 that is adjacent to and overlies inner layer 26. This outer layer 30 comprises a ceramic thermal barrier coating material (as previously described) and will normally comprise most of the thickness of TBC 22. Typically, outer layer 30 will comprise from about 50 to about 95%, more typically from about 70 to about 85%, of the thickness of TBC 22.

Various types of PVD and especially EB-PVD techniques well known to those skilled in the art can also be utilized to form high fracture toughness inner layer 26 of the TBCs 22 of this invention. See, for example, U.S. Pat. No. 5,645,893 (Rickerby et al), issued Jul. 8, 1997 (especially col. 3, lines 36-63); U.S. Pat. No. 5,716,720 (Murphy), issued Feb. 10, 1998) (especially col. 5, lines 24-61) and U.S. Pat. No. 6,447,854 (Rigney et al), issued Sep. 10 2002, which are incorporated by reference. Suitable EB-PVD techniques for use herein typically involve a coating chamber with a gas (or gas mixture) that preferably includes oxygen and an inert gas, though an oxygen-free coating atmosphere can also be employed. The ceramic thermal barrier coating materials are then evaporated with electron beams focused on, for example, ingots of the ceramic thermal barrier coating materials so as to produce a vapor of metal ions, oxygen ions and one or more metal oxides. The metal and oxygen ions and metal oxides recombine to form inner layer of 26 of TBC 22 on the surface of metal substrate 14, or more typically on bond coat layer 18. The porosity of inner layer 26 can be controlled within the desired range previously described by adjusting the conditions under which the PVD/EB-PVD technique is carried out during deposition of the zirconia-containing ceramic composition on the bond coat layer 18, in particular the pressure and/or temperature conditions (e.g., by reducing the pressure).

Various types of plasma-spray techniques well known to those skilled in the art can also be utilized to form high fracture toughness inner layer 26 of TBCs 22 of this invention. See, for example, Kirk-Othmer Encyclopedia of Chemical Technology, 3rd Ed., Vol. 15, page 255, and references noted therein, as well as U.S. Pat. No. 5,332,598 (Kawasaki et al), issued Jul. 26, 1994; U.S. Pat. No. 5,047,612 (Savkar et al) issued Sep. 10, 1991; and U.S. Pat. No. 4,741,286 (Itoh et al), issued May 3, 1998 (herein incorporated by reference) which are instructive in regard to various aspects of plasma spraying suitable for use herein. In general, typical plasma spray techniques involve the formation of a high-temperature plasma, which produces a thermal plume. The ceramic coating composition, e.g., ceramic powders, are fed into the plume, and the high-velocity plume is directed toward the bond coat layer 18. Various details of such plasma spray coating techniques will be well-known to those skilled in the art, including various relevant steps and process parameters such as cleaning of the bond coat surface 18 prior to deposition; grit blasting to remove oxides and roughen the surface, substrate temperatures, plasma spray parameters such as spray distances (gun-to-substrate), selection of the number of spray-passes, powder feed rates, particle velocity, torch power, plasma gas selection, oxidation control to adjust oxide stoichiometry, angle-of-deposition, post-treatment of the applied coating; and the like. Torch power can vary in the range of about 10 kilowatts to about 200 kilowatts, and in preferred embodiments, ranges from about 40 kilowatts to about 60 kilowatts. The velocity of the ceramic coating composition particles flowing into the plasma plume (or plasma "jet") is another parameter which is usually controlled very closely. Suitable plasma spray systems are described in, for example, U.S. Pat. No. 5,047,612 (Savkar et al) issued Sep. 10, 1991, which is incorporated by reference.

The outer thermal insulating layer 30 of TBC 22 can be applied, deposited or otherwise formed on inner layer 26 by any of the techniques previously described for forming inner layer 26 on bond coat layer 18. Typically, outer layer 30 is formed by depositing a zirconia-containing ceramic composition as previously described on the inner layer 26 by PVD, and especially EB-PVD, techniques, but without changing those parameters, such as pressure and/or temperature that reduce the porosity of the resulting layer that is formed.

Figure 3:
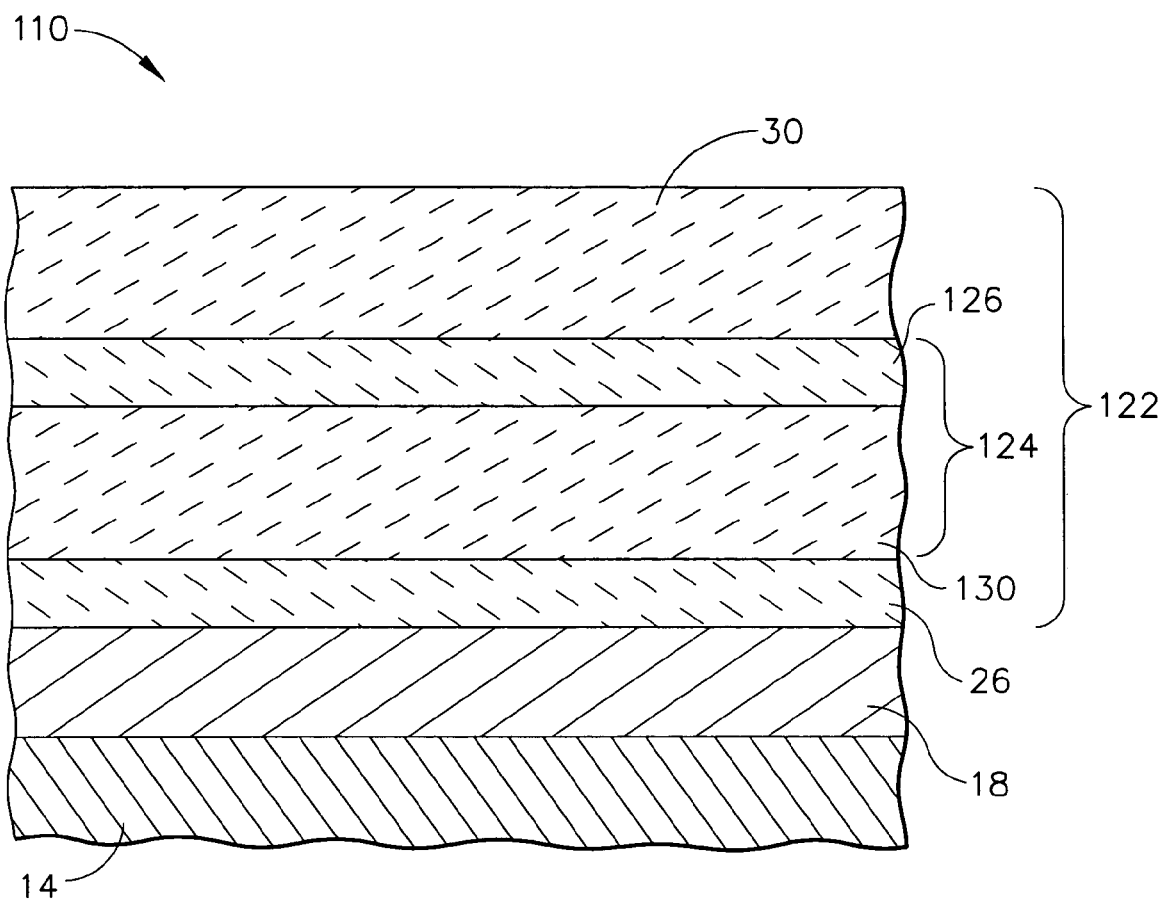
FIG. 3 is a partial side sectional view of an alternative embodiment of the thermal barrier coating and coated article of this invention.

An alternative embodiment of the article and TBC of this invention is shown in FIG. 3, with the alternative embodiment of this article being indicated 110, and the alternative embodiment of the TBC being indicated as 122, respectively. As shown in FIG. 3, TBC 122 further includes an intermediate section indicated as 124 between inner high fracture toughness layer 26 and outer thermal insulating layer 30. Section 124 of TBC 122 comprises a high fracture toughness layer 126 underlying and adjacent to outer thermal insulating layer 30 and a thermal insulating layer 130 overlaying and adjacent to inner high fracture toughness layer 26. Layer 126 has the general characteristics (e.g., in terms of thickness, composition and density) as those previously described for inner high fracture toughness layer 26. Similarly, thermal insulating layer 130 has the general characteristics (e.g., in terms of thickness and composition) as outer thermal insulating 30. Within the ranges of these previously described general characteristics, layer 126 can be formulated to have the same or different characteristics as inner layer 26. Similarly, thermal insulating layer 130 can be formulated to have the same or different characteristics as outer layer 30.

While section 124 of TBC 122 is shown in FIG. 3 as comprising one high fracture toughness layer 126 and one thermal insulating layer 130, section 124 can also comprise more than one (i.e., a plurality of) high fracture toughness layers 126 and thermal insulating layers 130 formed in an alternating fashion, i.e., no two high fracture toughness layers 126 are adjacent to each other, no two thermal insulating layers 130 are adjacent to each other, no high fracture toughness layers 26 and 126 are adjacent to each other, and no thermal insulating layers 30 and 130 are adjacent to each other. TBC 122 of FIG. 3 can be viewed alternatively as comprising a plurality of thermal insulating layers 30, 130 alternating with high fracture toughness layers 26, 126. It is believed that alternating thermal insulating layers 30, 130 with high fracture toughness layers 26, 126 can provide additional phonon scattering benefits, thus reducing the thermal conductivity of TBC 22.

While specific embodiments of this invention have been described, it will be apparent to those skilled in the art that various modifications thereto can be made without departing from the spirit and scope of this invention as defined in the appended claims.

What is claimed is:

1. A thermal barrier coating for an underlying substrate comprising:
    1. an inner high fracture toughness layer closest to the underlying substrate, the inner layer having a fraction of porosity of about 0.20 or less, and a thickness in the range of from about 0.5 to about 2 mils, and sufficient to impart impact resistance to the thermal barrier coating, and comprising a zirconia-containing ceramic composition having a c/a ratio of the zirconia lattice in the range of from about 1.011 to about 1.016 and stabilized in the tetragonal phase by a stabilizing amount of a stabilizing metal oxide selected from the group consisting of yttria, calcia, ceria, scandia, magnesia, india, lanthana, gadolinia, neodymia, samaria, dysprosia, erbia, ytterbia, europia, praseodymia, and mixtures thereof, wherein the inner layer comprises from about 0.3 to about 0.5% by weight of a metal oxide selected from the group consisting of lanthana, neodymia, gadolinia, and mixtures thereof; and 2. an outer thermal insulating layer adjacent to and overlying the inner layer and comprising a ceramic thermal baffler coating material.

2. The coating of claim 1 wherein the inner layer comprises from about 93 to about 96% by weight zirconia and from about 4 to about 7% by weight stabilizing metal oxide.

3. The coating of claim 2 wherein the c/a ratio is in the range of from about 1.013 to about 1.015.

4. The coating of claim 3 wherein the inner layer comprises from about 93.5 to about 95.5% by weight zirconia and from about 4.5 to about 6.5% by weight yttria as the stabilizing metal oxide.

5. The coating of claim 1 wherein the inner layer has a fraction of porosity of about 0.15 or less.

6. The coating of claim 1 wherein the inner layer has a fraction of porosity in the range of from about 0.10 to about 0.20.

7. The coating of claim 1 wherein the inner layer comprises from about 2 to about 7% by weight hafnia.

8. The coating of claim 7 wherein the inner layer comprises from about 4 to about 6% by weight hafnia.

9. The coating of claim 1 which comprises a plurality of alternating inner layers and outer layers.

10. A thermally protected article comprising:
A. a substrate; and
B. a thermal barrier coating comprising:
1. an inner high fracture toughness layer closest to the underlying substrate, the protective layer having a fraction of porosity in the range of from about 0.10 to about 0.20, and a thickness up to about 5 mils and sufficient to impart impact resistance to the thermal baffler coating, and comprising a zirconia-containing ceramic composition having a c/a ratio of the zirconia lattice in the range of from about 1.011 to about 1.016 and stabilized in the tetragonal phase by a stabilizing amount of a stabilizing metal oxide selected from the group consisting of yttria, calcia, ceria, scandia, magnesia, india, lanthana, gadolinia, and mixtures thereof, wherein the inner layer comprises from about 2 to about 7% by weight hafnia, and wherein the inner layer comprises from about 0.3 to about 0.5% by weight of a metal oxide selected from the group consisting of lanthana, neodymia, gadolinia, and mixtures thereof; and 2. an outer thermal insulating layer adjacent to and overlaying the inner protective layer and comprising a ceramic thermal baffler coating material.

11. The article of claim 10 wherein the substrate is a metal substrate and which further comprises a bond coat layer adjacent to and overlaying the metal substrate, and wherein the inner protective layer is adjacent to and overlies the bond coat layer.

12. The article of claim 10 wherein the thermal barrier coating has a thickness of from about 1 to about 100 mils.

13. The article of claim 12 which is a turbine engine component.

14. The article of claim 13 which is a turbine shroud and wherein the thermal baffler coating has a thickness of from about 30 to about 70 mils.

15. The article of claim 13 which is a turbine airfoil and wherein the thermal baffler coating has a thickness of from about 3 to about 30 mils.

16. The article of claim 10 wherein the inner layer has a thickness in the range of from about 0.5 to about 2 mils.

17. The article of claim 10 wherein the c/a ratio is in the range of from about 1.013 to about 1.015.

18. The article of claim 10 wherein the inner layer comprises from about 93.5 to about 95.5% by weight zirconia and from about 4.5 to about 6.5% by weight yttria as the stabilizing metal oxide.

19. The article of claim 10 wherein the inner layer has a fraction of porosity of about 0.15 or less.

20. The article of claim 10 wherein the thermal barrier coating comprises a plurality of alternating inner layers and outer layers.

* * * * *